US007120410B2

United States Patent
Shi (10) Patent No.: US 7,120,410 B2
(45) Date of Patent: Oct. 10, 2006

(54) LNA GAIN ADJUSTMENT IN AN RF RECEIVER TO COMPENSATE FOR INTERMODULATION INTERFERENCE

(75) Inventor: Hong Shi, Redondo Beach, CA (US)

(73) Assignee: Broadcom Corporation, Irvine, CA (US)

( * ) Notice: Subject to any disclaimer, the term of this patent is extended or adjusted under 35 U.S.C. 154(b) by 995 days.

(21) Appl. No.: 09/966,060

(22) Filed: Sep. 28, 2001

(65) Prior Publication Data
US 2003/0064695 A1   Apr. 3, 2003

(51) Int. Cl.
*H04B 17/00* (2006.01)
(52) U.S. Cl. .............................. 455/226.2; 455/234.1; 455/234.2; 455/239.1; 455/240.1; 455/245.1; 455/250.1; 455/283; 455/295; 455/296; 370/347; 375/345
(58) Field of Classification Search ................. 455/295, 455/296, 226.2, 234.1, 234.2, 239.1, 240.1, 455/245.1, 250.1, 283; 370/347; 375/345
See application file for complete search history.

(56) References Cited

U.S. PATENT DOCUMENTS 5,339,454 A    8/1994  Kuo et al.
5,722,061 A *  2/1998  Hutchison, IV et al. . 455/245.1
5,732,341 A    3/1998  Wheatley, III
6,052,566 A *  4/2000  Abramsky et al. ....... 455/67.11
6,324,387 B1 * 11/2001 Kamgar et al. .......... 455/234.1

FOREIGN PATENT DOCUMENTS

WO    WO 01 52429 A    7/2001

\* cited by examiner

*Primary Examiner*—Quochien B. Vuong
*Assistant Examiner*—Tuan H. Nguyen
(74) *Attorney, Agent, or Firm*—Garlick Harrison & Markison (57) ABSTRACT

A Radio Frequency (RF) receiver includes a low noise amplifier (LNA) and a mixer coupled to the output of the LNA. The gain of the LNA is adjusted to maximize signal-to-noise ratio of the mixer and to force the mixer to operate well within its linear region when an intermodulation interference component is present. The RF receiver includes a first received signal strength indicator (RSSI_A) coupled to the output of the mixer that measures the strength of the wideband signal at that point. A second received signal strength indicator (RSSI_B) couples after the BPF and measures the strength of the narrowband signal. The LNA gain is set based upon these signal strengths. By altering the gain of the LNA by one step and measuring the difference between a prior RSSI_B reading and a subsequent RSSI_B' reading will indicate whether intermodulation interference is present.

4 Claims, 10 Drawing Sheets

LNA GAIN ADJUSTMENT IN AN RF RECEIVER TO COMPENSATE FOR INTERMODULATION INTERFERENCE

FIELD OF THE INVENTION

This invention relates generally to wireless communications; and more particularly to the operation of a Radio Frequency (RF) receiver within a component of a wireless communication system.

BACKGROUND OF THE INVENTION

The structure and operation of wireless communication systems is generally known. Examples of such wireless communication systems include cellular systems and wireless local area networks, among others. Equipment that is deployed in these communication systems is typically built to support standardized operations, i.e. operating standards. These operating standards prescribe particular carrier frequencies, modulation types, baud rates, physical layer frame structures, MAC layer operations, link layer operations, etc. By complying with to these operating standards, equipment interoperability is achieved.

In a cellular system, a governmental body licenses a frequency spectrum for a corresponding geographic area (service area) that is used by a licensed system operator to provide wireless service within the service area. Based upon the licensed spectrum and the operating standards employed for the service area, the system operator deploys a plurality of carrier frequencies within the frequency spectrum that support the subscribers' subscriber units within the service area. These carrier frequencies are typically equally spaced across the licensed spectrum. The separation between adjacent carriers is defined by the operating standards and is selected to maximize the capacity supported within the licensed spectrum without excessive interference.

In cellular systems, a plurality of base stations is distributed across the service area. Each base station services wireless communications within a respective cell. Each cell may be further subdivided into a plurality of sectors. In many cellular systems, e.g., GSM cellular systems, each base station supports forward link communications (from the base station to subscriber units) on a first set of carrier frequencies and reverse link communications (from subscriber units to the base station) on a second set carrier frequencies. The first set and second set of carrier frequencies supported by the base station are a subset of all of the carriers within the licensed frequency spectrum. In most, if not all cellular systems, carrier frequencies are reused so that interference between base stations using the same carrier frequencies is minimized but so that system capacity is increased. Typically, base stations using the same carrier frequencies are geographically separated so that minimal interference results.

Both base stations and subscriber units include Radio Frequency (RF) transmitters and RF receivers. These devices service the wireless links between the base stations and subscriber units. Each RF receiver typically includes a low noise amplifier (LNA) that receives an RF signal from a coupled antenna, a mixer that receives the output of the LNA, a band-pass filter coupled to the output of the mixer, and a variable gain amplifier coupled to the output of the mixer. These RF receiver components produce an Intermediate Frequency (IF) signal that carries modulated data.

In order to improve the signal-to-noise ratio of an RF signal presented to the mixer by the LNA, the gain of the LNA is adjusted. In adjusting the gain of the LNA, great care must be taken. While maximizing the gain of the LNA serves to increase the Signal to Noise Ratio (SNR) of the RF signal, if the LNA gain is too large, the mixer will be driven into non-linear operation and the IF signal produced by the mixer will be distorted. Such is the case because a non-linear operating region of the mixer resides at an upper boundary of its operating range of the mixer. The input power level at which non-linearity is a problem for the mixer is often referred to as a 1 dB compression level. Thus, it is desirable to have the LNA provide as great an amplification of the received RF signal as possible prior to presenting the amplified RF signals to the mixer without driving the mixer into non-linear operation. During most operating conditions, the gain of the LNA may be set by viewing the input power present at the LNA and by setting the LNA gain to produce an output that causes the mixer to operate in a linear region.

However, when intermodulation interference exists, this technique for setting the LNA gain does not work. Intermodulation interference occurs when the mixer receives RF carriers (in addition to the desired signal) that cause the mixer to produce intermodulation components at the IF, the same frequency as the desired signal. This problem is well known and is a non-linear phenomenon associated with the operation of the mixer. The intermodulation component at the frequency of the desired signal is a third-order intermodulation component, IM3. In order to minimize intermodulation interference, the gain of the LNA should be reduced. However, reducing the gain of the LNA also reduces the SNR of the signal produced by the mixer. Thus, competing operational goals exist by the competing goals of increasing SNR by increasing the gain of the LNA and by reducing the effects of intermodulation interference by reducing the gain of the LNA.

While this problem is well known, its solution is not. Some prior techniques have simply avoided high LNA gain when wideband received signal strength (across some portion of the operating range of the RF receiver) was approximately equal to the narrowband received signal strength (at the IF). Further, when the wideband received signal strength was significantly greater than the narrowband received signal strength, the gain of the LNA was set to a low level. These operations addressed the issue of the existence of interferers. However, it did not consider whether intermodulation interference existed.

Thus, there is a need in the art to improve the operational characteristics of the LNA in order to maximize signal-to-noise ratio and to minimize the effects of intermodulation interference.

SUMMARY OF THE INVENTION

Thus, in order to overcome the above-described shortcomings as well as other shortcomings of the present devices and methodologies, a method and system of the present invention adjusts the gain of a low noise amplifier (LNA) to maximize signal-to-noise ratio without driving a corresponding mixer into non-linear operation. An RF receiver constructed according to the present invention includes a LNA coupled to an antenna. The LNA gain adjusts a received signal. Coupled to the output of the LNA is a mixer that mixes the level adjusted received signal with a Local Oscillator (LO) to produce a wideband signal about an Intermediate Frequency (IF). A Band Pass Filter (BPF) receives the wideband signal output of the LO and band pass filters the output to produce a narrowband signal at the IF. The output of the BPF is received by a Variable Gain Amplifier (VGA) that amplifies the IF signal of interest. The output of the VGA is received by another components of a corresponding subscriber unit that extracts data from the IF signal of interest.

According to the present invention, this RF receiver includes a wideband received signal strength indicator (RSSI_A) coupled to the output of the mixer that measures the strength of the wideband signal at that point. A second received signal strength indicator (RSSI_B) couples to the received signal path after the BPF and measures the strength of the narrowband signal of interest after the BPF. Thus, in combination, the RSSI_A and the RSSI_B indicate the respective strengths of the wideband signal produced by the mixer and the narrowband signal produced by the mixer after filtering by the BPF, respectively. The structure of the present invention also includes an LNA gain adjustment block that receives the RSSI_A and RSSI_B indications, and controls the gain of the LNA to maintain linearity of the mixer and also to maximize the Signal to Noise Ratio (SNR) of the IF signal of interest produced by the RF receiver.

Operation according to the present invention commences during a guard period when the signal of interest is not present. During this guard period, any signal at the IF is not actually the signal of interest but is an intermodulation interference product or a signal transmitted at the carrier frequency from another source, e.g., distant base station. As is generally known, a third order intermodulation interference product (IM3) is caused by two strong adjacent channel interferers at appropriate separations. When these two strong adjacent channel interferers are applied to the mixer, the IM3 component is produced at the IF.

After the guard period has commenced, a timer is set that when expired indicates that the guard period has expired. Then, the LNA gain is initially set, in one embodiment to a maximum gain, e.g., 20 dB. Then, the wideband received signal strength, RSSI_A, is measured. If the wideband signal will drive the mixer into 1 dB compression (non-linearity), i.e., RSSI_A exceeds a first threshold (−23 dBm), the LNA gain is reduced. Then, it is determined whether the RSSI_A exceeds a second threshold, e.g., −43 dBm, to indicate that the mixer will be in its upper range. If not, the LNA gain is set to maximize SNR. However, if the second threshold is exceeded by RSSI_B, a determination is made as to whether the narrowband signal strength, RSSI_B exceeds a third threshold, e.g., −102 dBm. If RSSI_B exceeds the third threshold, either an IM3 component exists or an in band interferer from a remote source exists.

Next, operation according to the present invention determines if the narrowband signal is an IM3 component. Such operation is accomplished by altering the gain of the LNA by one step and measuring the difference between the prior RSSI_B and the gain adjusted RSSI_B. Because the IM3 component is a non-linear one, if the difference in RSSI_B exceeds a linear range, IM3 is present. In such case, the LNA gain is reduced to ensure that the mixer will operate well within its linear range. If not, the LNA gain is set to maximize SNR.

Thus, the operation and structure of the present invention detects an IM3 intermodulation interference component when it is present and adjusts operation accordingly to compensate for the IM3 component. Therefore, the present invention intelligently sets the LNA gain to not only maximize SNR when such is possible but sets the LNA gain so that the mixer will operate well within its linear range when an IM3 component is present. Other features and advantages of the present invention will become apparent from the following detailed description of the invention made with reference to the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE INVENTION

Figure 1:
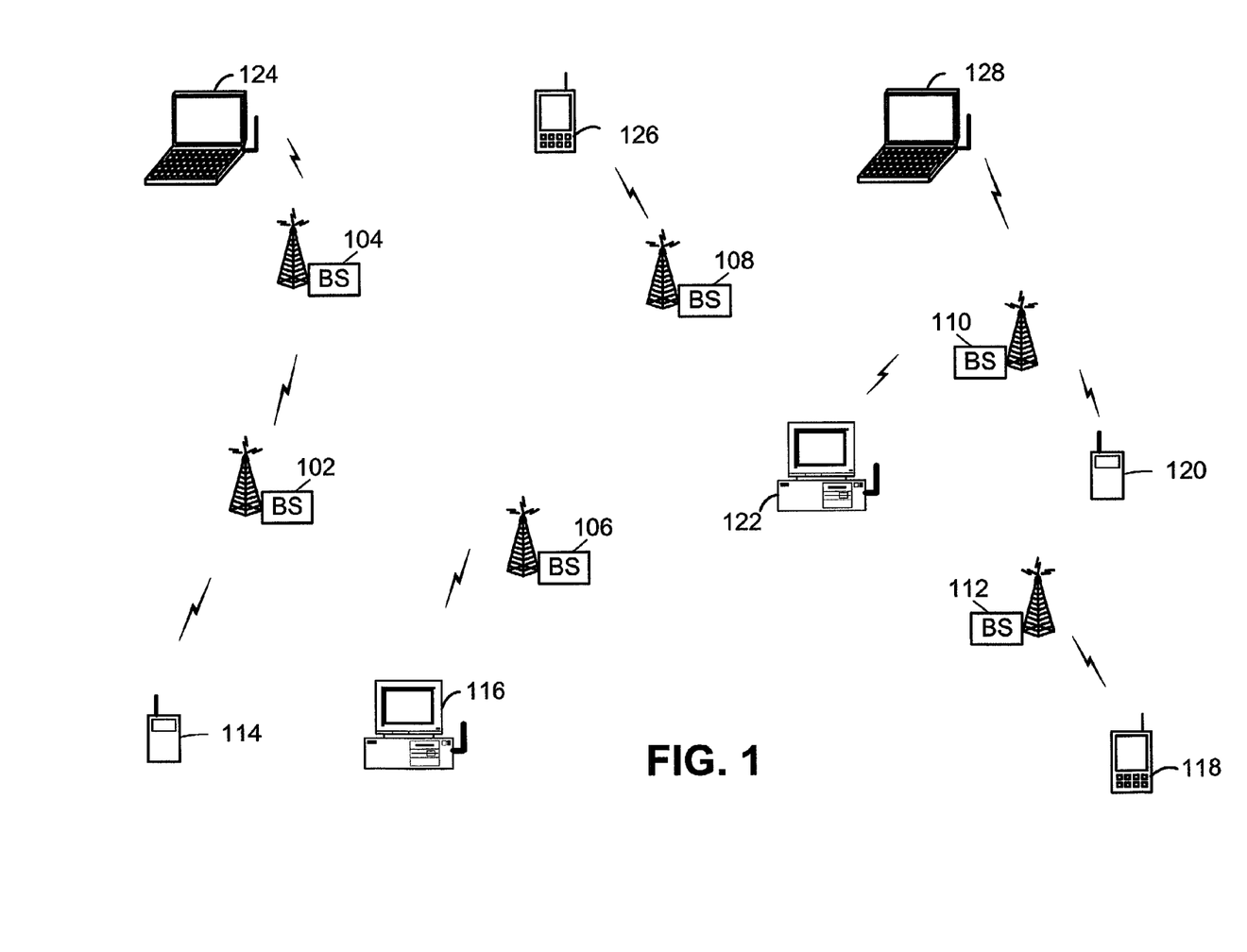
FIG. 1 is a system diagram illustrating a cellular system within which the present invention is deployed.

FIG. 1 is a system diagram illustrating a cellular system within which the present invention is deployed. The cellular system includes a plurality of base stations 102, 104, 106, 108, 110, and 112 that service wireless communications within respective cells/sectors. The cellular system services wireless communications for a plurality of wireless subscriber units. These wireless subscriber units include wireless handsets 114, 120, 118, and 126, mobile computers 124 and 128, and desktop computers 116 and 122. When wirelessly communicating, each of these subscriber units communicates with one (or more during handoff) of the base stations 102 through 112. Each of the subscriber units of FIG. 1, both subscriber units and base stations includes radio frequency circuitry.

The services provided by the cellular system include both voice service and data services. Such services are provided according to a cellular networking standard such as the GSM standards, the IS-136 standards, the IS-95 standards, the 1xRTT standards, the 1XEV-DO standards, the 1XEV-DV standards, other operating standards in which communications are carried on a number of carriers across a frequency spectrum.

Figure 2:
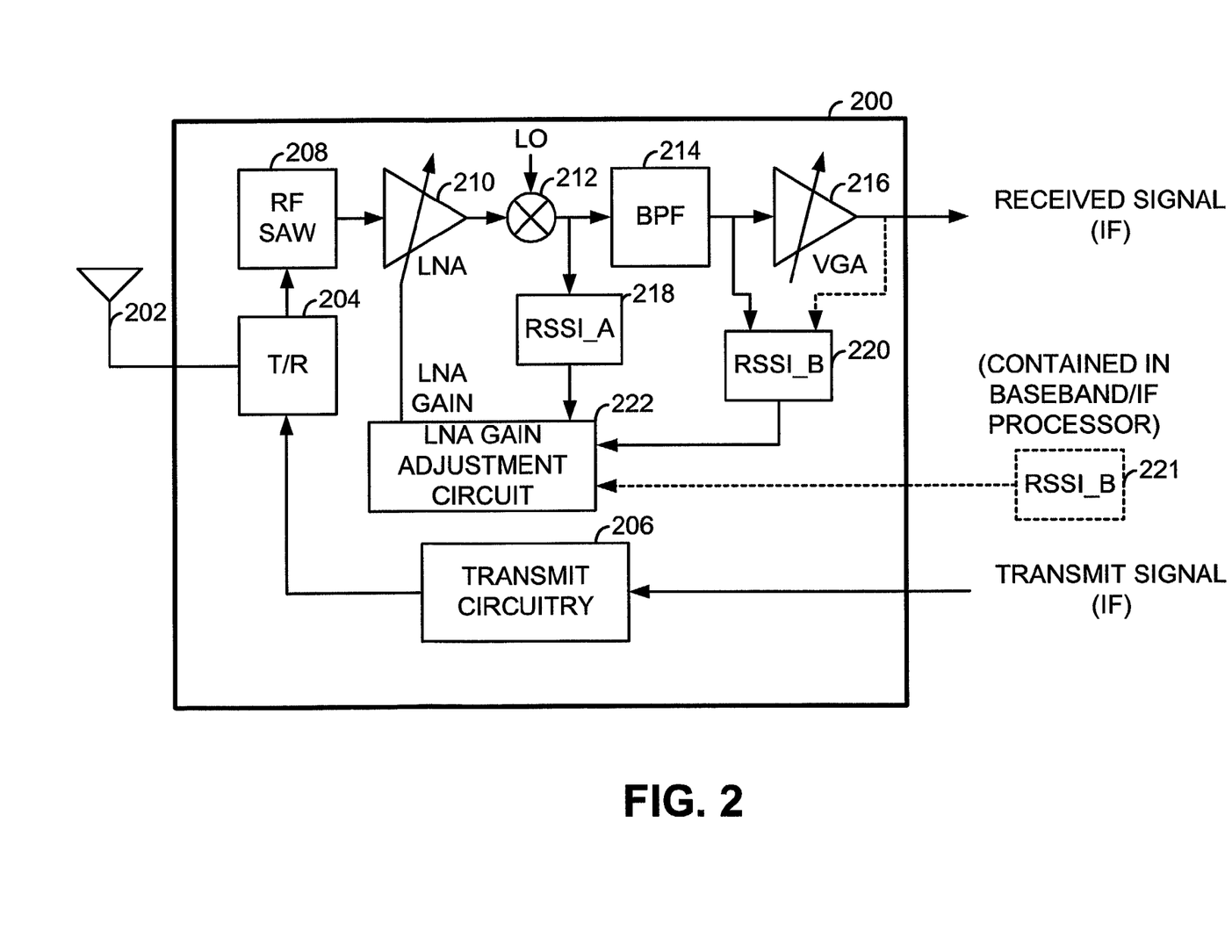
FIG. 2 is a block diagram illustrating a Radio Frequency (RF) unit that operates according to the present invention.

FIG. 2 is a block diagram illustrating a Radio Frequency (RF) unit that operates according to the present invention and that is present in the subscriber units 114–128 and/or the base stations 102–112 of FIG. 1. As shown, the RF unit 200 includes an antenna 202 that couples to a transmit/receive block 204. The transmit/receive block 204 couples to transmit circuitry 206. The transmit circuit 206 receives an Intermediate Frequency (IF) transmit signal, up-converts the IF transmit signal to an RF transmit signal, and couples the RF transmit signal to the transmit/receive block 204 that couples the RF transmit signal to the antenna 202.

The transmit/receive switch 204 also couples the antenna 202 to an RF SAW circuit 208 so that the RF SAW circuit 208 receives an RF receive signal. The output of the RF SAW circuit 208 is received by low noise amplifier (LNA) 210. Associated with the LNA 210 is a LNA gain (LNA_G). The LNA 210 amplifies the signal received at its input from the RF SAW 208 by the LNA_G receives to produce an output which it applies to mixer 212. Mixer 212 mixes a Local Oscillator (LO) input with the output of the LNA 210 to produce an IF receive signal. The output of the mixer 212 is received by band-pass filter (BPF) 214, which filters the output of the mixer 212 within a frequency band of interest. Residing within this frequency band of interest is an IF signal that carries modulated data. The output of the BPF 214 is amplified via a Variable Gain Amplifier (VGA) 216. The VGA 216 produces the IF received signal as its output. The RF unit couples to additional c.

According to the present invention, the RF unit 200 includes two received signal strength indicators (RSSIs). A first RSSI, RSSI_A 218, measures the signal strength of a wideband signal produced by the mixer 212. The wideband signal whose strength the RSSI_A 218 measures the combined strength of a plurality of carriers that the RF unit 200 operates upon and that are down converted by the mixer. A second RSSI, RSSI_B 220, receives as its input the output of the BPF 214. Thus, the RSSI_B 220 measures the received signal strength within the frequency band output by the BPF 214, a narrowband signal. The narrowband frequency corresponds to the frequency of the IF receive signal that contains modulated data intended for a wireless device containing the RF unit 200 (a signal of interest). In a first alternate embodiment, the RSSI_B 220 receives as its input the output of the VGA 216. In a second alternate embodiment, an RSSI_B 221 is present in a coupled baseband/IF processor that is separate from the RF unit 200. Thus, as is illustrated in these alternate embodiments, the RSSI_B need not be directly coupled to the output of the BPF 214 but must be able to measure narrowband signal strength in the received signal path.

LNA gain adjustment block 222 receives the measured received signal strengths from the RSSI_A 218 and the RSSI_B 220. Based upon these two inputs, the LNA gain adjustment block 222 produces the LNA_G for the LNA 210. The LNA gain adjustment block 222 satisfies various competing criterion. Generally speaking, the LNA gain adjustment block 222 selects an LNA_G to maximize the Signal to Noise Ratio (SNR) of the IF signal produced by the RF unit 200 while operating the mixer 212 in its linear range. Further, the LNA gain adjustment block 222 detects intermodulation interference and, when detected, adjusts the LNA_G so that the mixer 212 operates well within its linear range.

The LNA gain adjustment block 222 may be dedicated hardware, may be a combination of hardware and software, or may be implemented in software. Further, the RSSI_B 220, when contained in the RF unit 200, will be implemented mostly/fully implemented in hardware. However, the RSSI_B 221 contained in the baseband/IF processor may be implemented partially/fully in software.

Figure 3A:
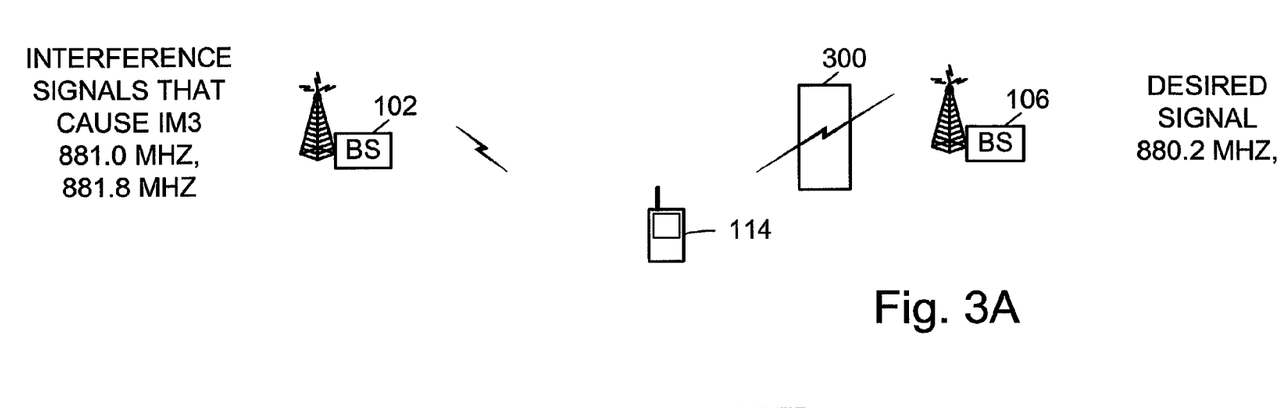
FIG. 3A is a system diagram illustrating a portion of the system of FIG. 1 in which intermodulation interference is produced.

FIG. 3A is a system diagram illustrating a portion of the system of FIG. 1 in which intermodulation interference is produced. The example of FIG. 3A shows one possible operating condition of the system of FIG. 1 in which a large third order modulation product (IM3) is present. Of course, many various other operating conditions may also produce large IM3 products. As shown in FIG. 3A, subscriber unit 114 receives forward link transmissions from base station 106 at a carrier frequency of 880.2 MHz. However, these forward link transmissions from the base station 106 to the subscriber unit 114 pass through an obstacle 300 that weakens the received signal. Base station 102 transmits forward link signals to other subscriber units at the carrier frequencies of 881.0 MHz and 881.8 MHz.

Figure 3B:
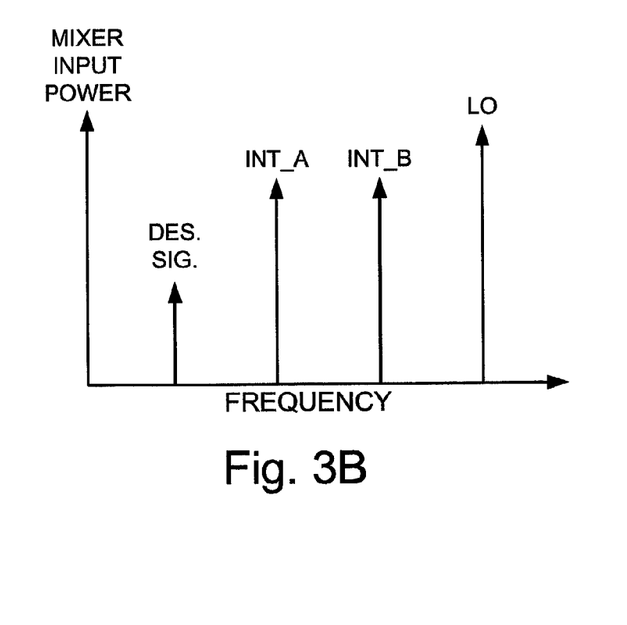
FIGS. 3B and 3C are diagrams illustrating how the mixer of an RF unit of a subscriber unit produces an intermodulation interference signal, IM3, when strong adjacent channel interferers are present.
Figure 3C:
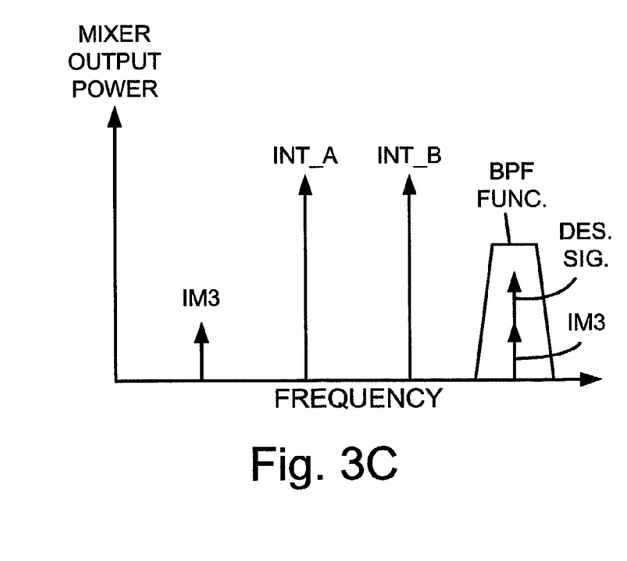

FIGS. 3B and 3C are diagrams illustrating how the mixer 212 of an RF unit 200 of the subscriber unit 114 produces an intermodulation interference signal, IM3, when the strong adjacent channel interferers are present. FIG. 3B illustrates the mixer input power present within the RF unit of subscriber unit 114. As is shown, interfering carrier (INT_A) is present at 881.0 MHz and interfering carrier (INT_B) is present at 880.2 MHz. The signal separation between INT_A and INT_B is 800 KHz. Further, the separation between INT_A and the desired carrier that carries the signal of interest at 880.2 MHz is 800 KHz and the LO input is at a higher frequency than each of the carrier frequencies. The frequency separation between the LO and the desired carrier is equal to the IF.

FIG. 3C illustrates the output power at the mixer of the RF unit in the receive path for subscriber unit 114. As is shown, interfering signals INT_A and INT_B produce intermodulation components of the third order, IM3, that coexist with the IF of the desired signal. When the desired signal is relatively weak, the IM3 component is relatively large as compared to the power of the desired signal. The band-pass filter can do nothing to remove the IM3 component which is additive to the desired signal at the IF. Thus, the RF unit simply passes both the desired signal and the IM3 component at the IF to demodulating section of the subscriber unit 114.

With the relatively large IM3 component at the IF, the demodulating section of the subscriber unit 114 will have difficulty extracting modulated data. Thus, high bit error rates and lost packets may occur when the large IM3 component exists. Thus according to the present invention, during a guard period when the desired signal is not present, the gain of the LNA 210 is adjusted by the LNA gain adjustment block 222 to minimize the impact of the IM3 component by ensuring that the mixer 212 operates well within its linear region. These operations are described in detail with reference to FIGS. 4A through 7.

Figure 4A:
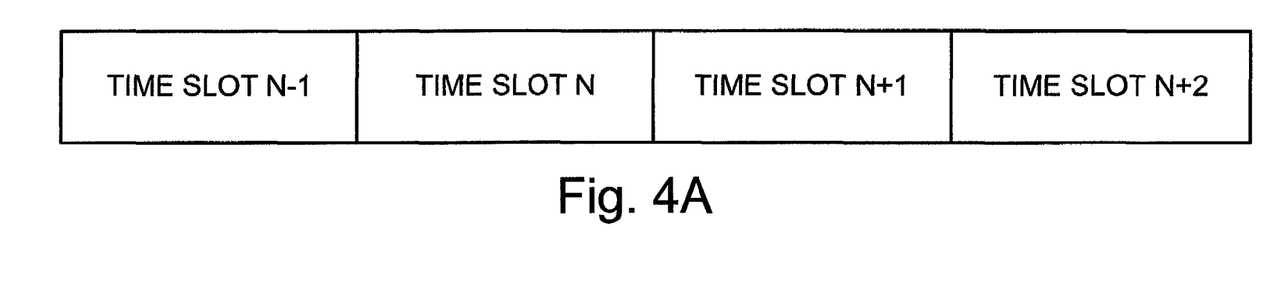
FIG. 4A is a diagram illustrating the structure of TDMA Time Slots employed in a system that operates according to the present invention.

FIG. 4A illustrates the structure of TDMA time slot employed in a system that operates according to the present invention. As is shown in FIG. 4A, transmissions on any carrier within the wireless communication system occur in time slots. Such is the case in almost all systems but particularly in TDMA systems. These time slots are transmitted somewhat continually by the base station to a subscriber unit during an ongoing communication.

Figure 4B:
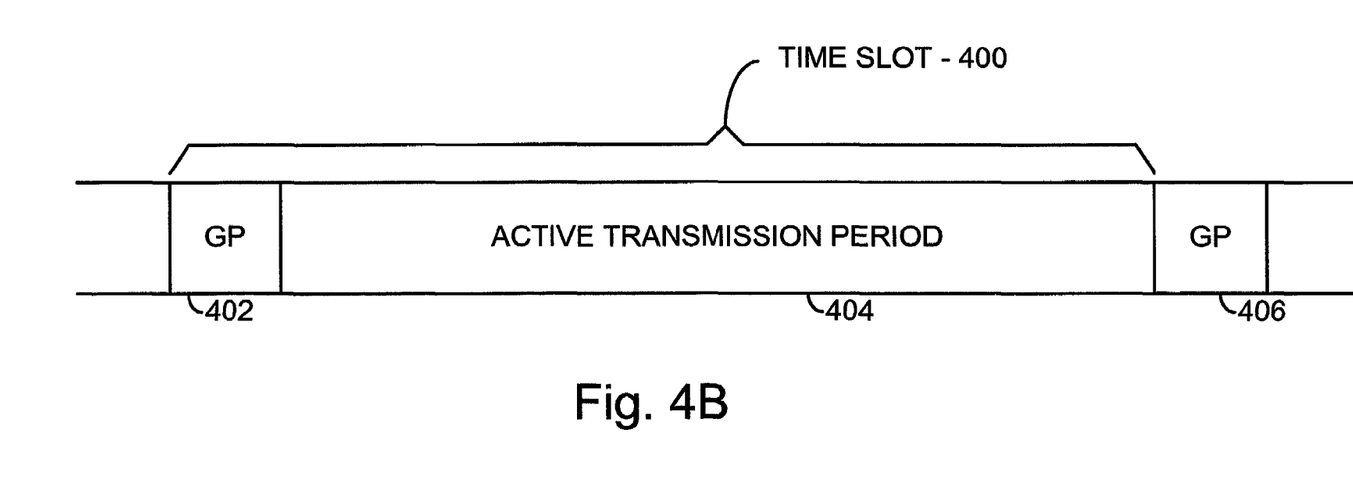
FIG. 4B is a diagram illustrating the structure of a Time Slot according to the present invention.

FIG. 4B is a diagram illustrating the structure of a time slot according to the present invention. As is shown, the time slot 400 includes a guard period 402 and an active transmission period 404, followed by the guard period of a subsequent time slot. During the guard period 402, the carrier corresponding to the desired signal is not present.

During this guard period, the LNA gain adjustment block 222 operates to adjust the LNA_G according to the present invention.

Figure 5:
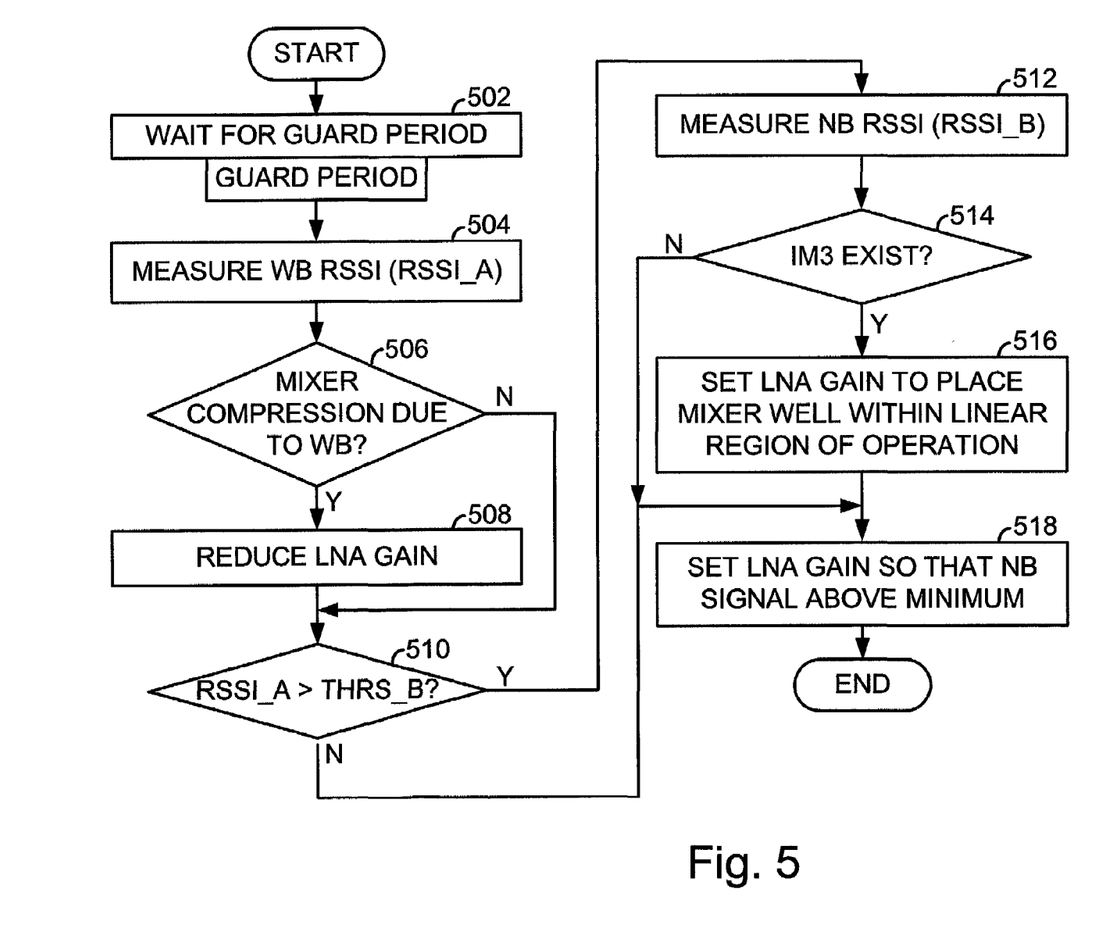
FIG. 5 is a logic diagram illustrating generally operation according to the present invention.

FIG. 5 is a logic diagram illustrating generally operation according to the present invention. As shown in FIG. 5, operation commences after the guard period has commenced (step 502). When the guard period commences, a guard period timer may be set to expire when the guard period ends. Then, the wideband received signal strength (RSSI_A) is measured (step 504). Then, it is determined whether mixer non-linearity (1 dB compression) is caused based upon the strength of the wideband signal present at the mixer (step 506). If the determination at step 506 is affirmative, the LNA_G is reduced at step 508 until it is determined that the mixer is no longer driven into 1 dB compression due to the wideband signal.

If the mixer is not driven into 1 dB compression due to the wideband signal, as determined at step 506, it is next determined whether the wideband signal strength, RSSI_A, exceeds a particular threshold (THRS_B) to indicate that the wideband signal alone will cause the mixer to operate in its upper range. If this threshold is exceeded at step 510, operation proceeds to step 512 where the narrowband receive signal strength is measured via RSSI_B (step 512). With both the wideband received signal strength and narrowband received signal strength, measured operation is performed to determine whether intermodulation interference exists (step 514).

In determining whether IM3 exists, IM3 is first characterized by Equation (1) as:

$$IM3(dBm)=3*Pin(dB)-2*IIP3(dBm) \qquad \text{Equation (1)}$$

where:
Pin=Input Power of the Mixer; and
IIP3=$3^{rd}$ Order Intercept Point of the Mixer.

Thus, when an IM3 component exists, its existence will be revealed by:
(1) measuring RSSI_B;
(2) altering the LNA_G;
(3) measuring again RSSI_B; and
(4) determining that the change in RSSI_B (dB) was greater than the alteration in LNA_G (dB). Such is the case because the IM3 component is not a linear function of LNA_G.

If intermodulation interference does exist, the LNA_G is set to optimize the signal-to-interference ratio of the mixer (step 516) by causing the mixer to operate well within its linear range. In one particular embodiment of step 516, the LNA_G is reduced until the IM3 component, as indicated by RSSI_B is lower than a predefined threshold. From both step 516 and when RSSI_A did not exceed THRS_B, operation proceeds to step 518 wherein the LNA_G is set so that the narrowband signal exceeds a minimum.

Figure 6:
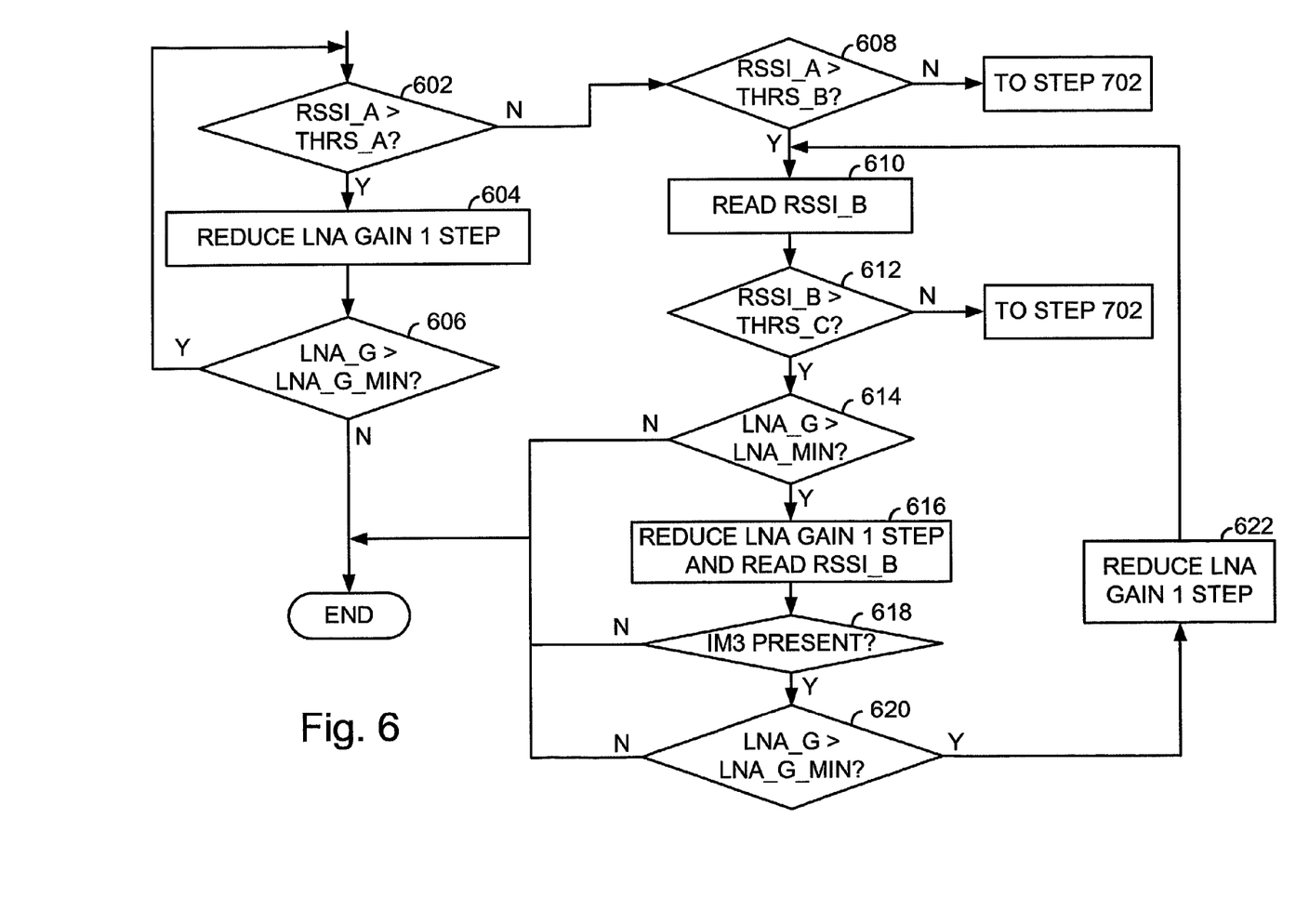
FIGS. 6 and 7 are logic diagrams illustrating in more detail operation according to the present invention.
Figure 7:
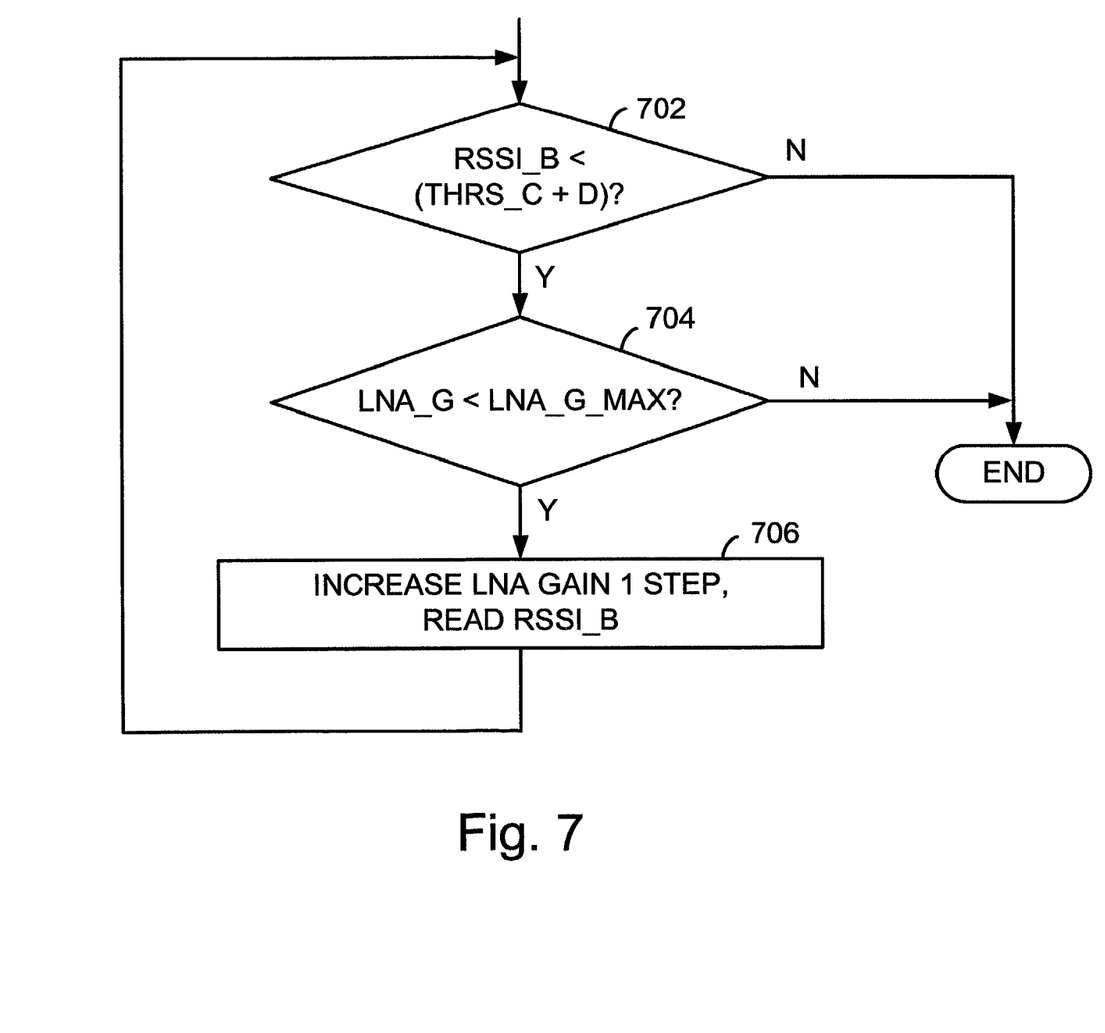

FIGS. 6 and 7 are logic diagrams illustrating in more detail operation according to the present invention as was described in FIG. 5. In the description of FIG. 6, THRS_A, is chosen as −23 dBm, THRS_B is selected as −43 dBm, THRS_C is selected as −102 dBm and a Delta, D, is selected at 6 dB. From step 504 of FIG. 5, operation proceeds to step 602 of FIG. 6 in the more detailed description of FIG. 6. In such case, the wideband received signal strength, RSSI_A, is compared to THRS_A (−23 dBm). If RSSI_A exceeds THRS_A, operation proceeds to step 604 where LNA_G is reduced by one step. In the particular example of FIG. 6, the LNA_G may be set at any of 20, 16, 12, 8, 4, and 0 dB. Thus, the gain step is 4 dB, the max gain is 20 dB and the minimum gain is 0 dB. From step 604, operation proceeds to step 606 where it is determined whether the current LNA_G is greater than LNA_G_MIN (0 dB). If so, operation proceeds again to step 602. If not, operation ends and the minimum LNA_G of 0 dB is used until the operation of FIG. 6 is again employed to adjust LNA_G.

When RSSI_A does not exceed THRS_A, operation proceeds to step 608 where it is determined whether RSSI_A exceeds THRS_B (−43 dBm). If not, operation proceeds to step 702 of FIG. 7. If so, the narrowband received signal strength RSSI_B is measured (step 610). Next, it is determined whether RSSI_B exceeds THRS_C (−102 dBm) (step 612). If not, operation proceeds to step 702 of FIG. 7. If so, it is determined whether the LNA_G is greater than the LNA_G_MIN (step 614). If not, operation ends.

If so, the LNA_G is reduced by one step and the narrowband received signal strength is again read (step 616). Next, it is determined whether an intermodulation interference component IM3 is present (step 618). In making this determination, it is assumed that intermodulation component IM3 will be revealed when RSSI_B decreases non-linearly with a decrease in LNA_G. Thus, the dB decrease in RSSI_B caused by the dB reduction in LNA_G (measurement at step 610 versus measurement at step 616) is compared to the dB reduction in LNA_G. If the dB decrease in RSSI_B is not linearly related to the dB decrease in LNA_G, IM3 is present. In one particular embodiment, the inequality of Equation (2) is employed to detect IM3:

$$RSSI\_B-RSSI\_B'>(LNA\_G+3) \qquad \text{Equation (2)}$$

where:
RSSI_B=measurement at step 610;
RSSI_B'=measurement at step 616; and
LNA_G=LNA_G at step 610.

When this equation is satisfied, a third order intermodulation product IM3 is present. If IM3 product is not present, as determined at step 618, operation ends. If IM3 is present, as determined at step 618, it is next determined whether the LNA_G is greater than the minimum LNA_G (step 620). If not, operation ends. If so, the LNA_G is reduced by one step (step 622) and operation proceeds again to step 610. Therefore, when the mixer is operating in its upper region and IM3 is detected, LNA_G is reduced until RSSI_B does not exceed THRS_C (−102 dBm). Such adjustment of LNA_G will cause the mixer to operate well within its linear range.

Referring now to FIG. 7, at step 702, RSSI_B is compared to the difference between THRS_C (−102 dBm) and Delta (6 dBm). If RSSI_B is less than (THRS_C+Delta), it is next determined whether LNA_G is less than the LNA_G_MAX (step 704). If so, the LNA_G is increased by one step, the RSSI_B is again measured (step 706) and operation returns to step 702. If at step 702 or 704 a negative determination is made, operation ends.

Figure 8:
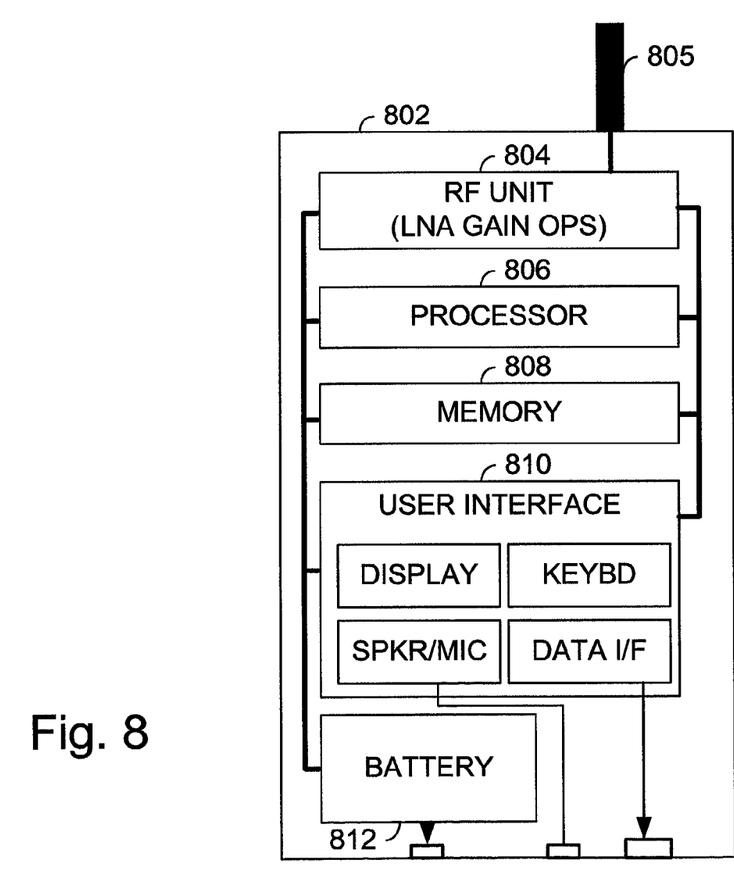
FIG. 8 is a block diagram illustrating the structure of a subscriber unit constructed according to the present invention.

FIG. 8 is a block diagram illustrating the structure of a subscriber unit 802 constructed according to the present invention. The subscriber unit 802 operates with a cellular system, such at that described with reference to FIG. 1 and according to the operations described with reference to FIGS. 2–7. The subscriber unit 802 includes an RF unit 804, a processor 806, and a memory 808. The RF unit 804 couples to an antenna 805 that may be located internal or external to the case of the subscriber unit 802. The processor 806 may be an Application Specific Integrated Circuit (ASIC) or another type of processor that is capable of operating the subscriber unit 802 according to the present invention. The memory 808 includes both static and dynamic components, e.g., DRAM, SRAM, ROM, EEPROM, etc. In some embodiments, the memory 808 may be partially or fully contained upon an ASIC that also includes the processor 806. A user interface 810 includes a display, a keyboard, a speaker, a microphone, and a data interface, and may include other user interface components. The RF unit 804, the processor 806, the memory 808, and the user interface 810 couple via one or more communication buses/links. A battery 812 also couples to and powers the RF unit 804, the processor 806, the memory 808, and the user interface 810.

The RF unit 804 includes the components described with reference to FIG. 2 and operates according to the present invention to adjust the LNA gain. The structure of the subscriber unit 802 illustrated is only an example of one subscriber unit structure. Many other varied subscriber unit structures could be operated according to the teachings of the present invention.

Figure 9:
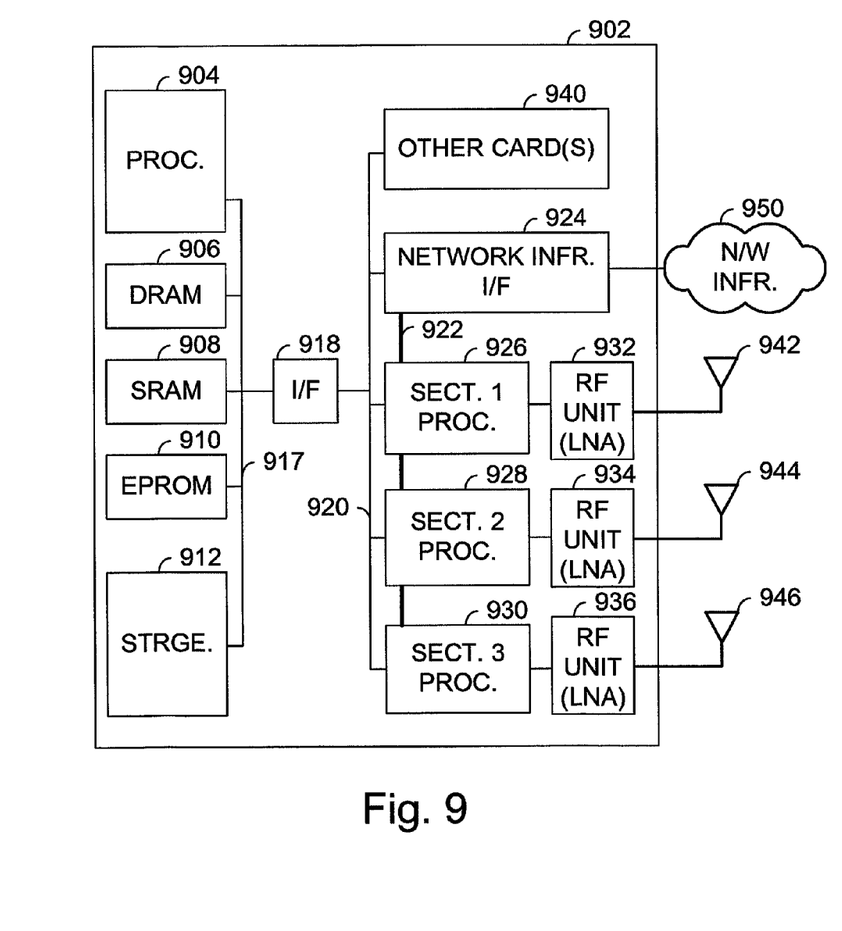
FIG. 9 is a block diagram illustrating the structure of a base station according to the present invention.

FIG. 9 is a block diagram illustrating the structure of a base station 902 constructed according to the present invention. The base station 902 includes a processor 904, dynamic RAM 906, static RAM 908, EPROM 910, and at least one data storage device 912, such as a hard drive, optical drive, tape drive, etc. These components (which may be contained on a peripheral processing card or module) intercouple via a local bus 917 and couple to a peripheral bus 920 (which may be a back plane) via an interface 918. Various peripheral cards couple to the peripheral bus 920. These peripheral cards include a network infrastructure interface card 924, which couples the base station 902 to a wireless network infrastructure 950.

Digital processing cards 926, 928 and 930 couple to Radio Frequency (RF) units 932, 934, and 936, respectively. Each of these digital processing cards 926, 928, and 930 performs digital processing for a respective sector, e.g., sector 1, sector 2, or sector 3, serviced by the base station 902. The RF units 932, 934, and 936 couple to antennas 942, 944, and 946, respectively, and support wireless communication between the base station 902 and subscriber units. Further, the RF units 932, 934, and 936 operate according to the present invention. The base station 902 may include other cards 940 as well.

Figure 10:
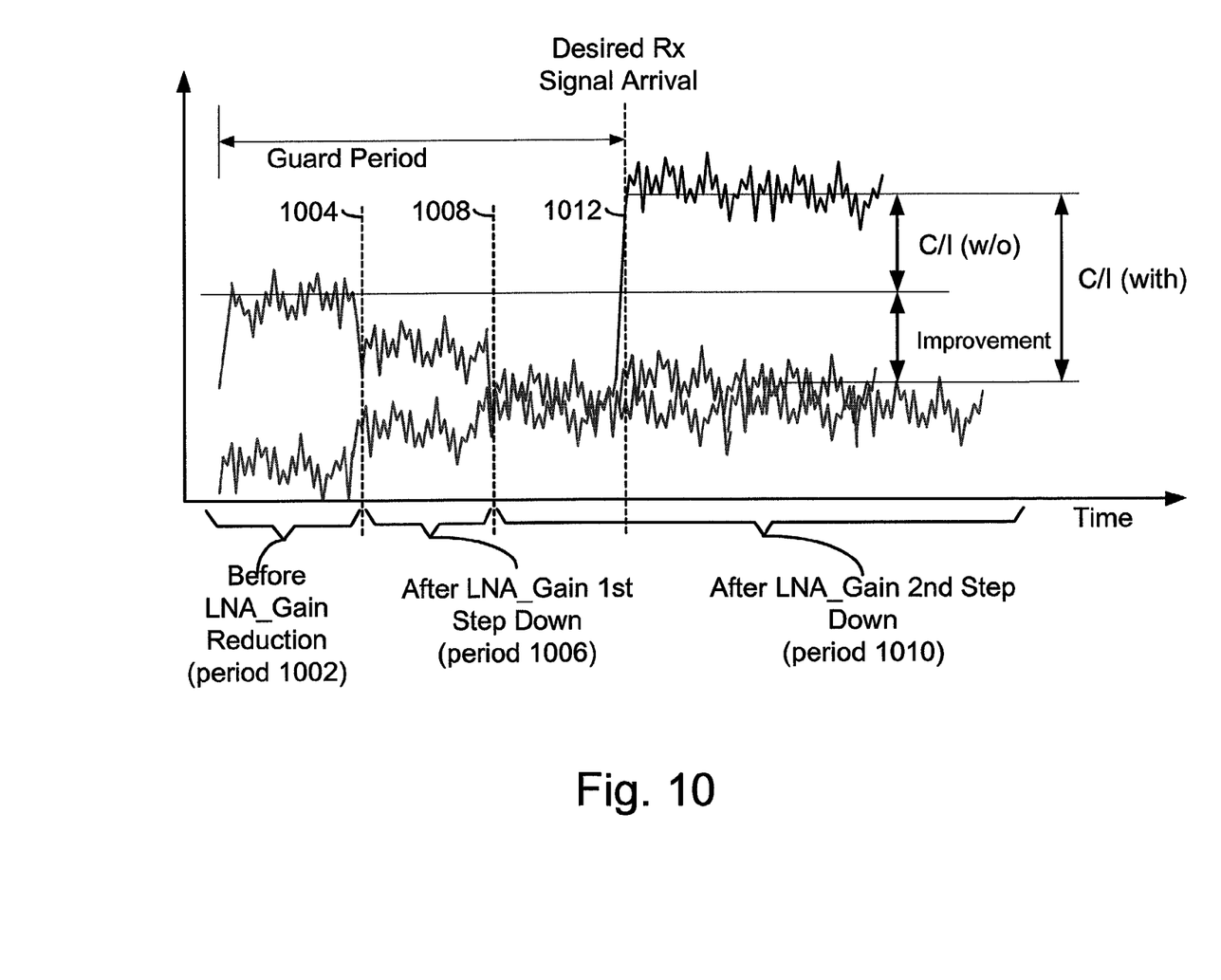
FIG. 10 is a graph showing the power of received signals present at the input of a mixer during operation according to the present invention.

FIG. 10 is a graph showing the power of received signals present at the input of a mixer during operation according to the present invention. Time increases to the right in the graph, commending with a guard period, during which no desired signal is present. However, thermal noise and an intermodulation interference component IM3, are both present. During a first portion of the guard period (period 1002), the LNA_G is set to a maximum gain and the LNA Gain Adjustment Circuit determines that IM3 is present. At transition 1004, the LNA_G is reduced by one step and, resultantly, the IM3 component decreases non-linearly and the thermal noise increases linearly. Thus, during period 1006, the IM3 component has decreased non-linearly while the thermal noise floor has increased linearly.

At transition 1008, the LNA_G is reduced by another step. Resultantly, IM3 decreases again non-linearly while the thermal noise floor increases linearly. After the transition 1008, during period 1010, the magnitude of IM3, which is decreasing substantially, meets the level of the noise floor. At transition 1012, the guard period expires and the desired signal is present. At this time, the signal of interest will be present with a carrier-to-interference ratio (C/I). This is denoted as C/I (with). If the gain of the LNA had not been adjusted, the C/I ratio (without) would have been less and a coupled modulator would have had more difficulty in extract data from the desired signal.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A method for adjusting the gain of a Low Noise Amplifier (LNA) in an RF unit that includes the LNA, a mixer coupled to the output of the LNA, a Band Pass Filter (BPF) coupled to the output of the mixer, a first received signal strength indicator coupled to measure the wideband signal strength at the output of the mixer, and a second received signal strength indicator coupled to measure the narrowband signal strength after the BPF, the method comprising:

determining that a signal of interest is not present in a received RF signal present at an input of the LNA;

measuring wideband signal strength indication (RSSI_A) by use of the first received signal strength indicator at the output of the mixer;

determining if mixer non-linearity is present based upon RSSI_A;

reducing gain of the LNA if mixer non-linearity is present based upon RSSI_A, until the mixer is no longer driven into non-linearity;

determining if RSSI A exceeds a predefined threshold (THUR_B) that will cause the mixer to operate in an upper range of mixer operation;

measuring narrowband signal strength indication (RSSI_B) by use of the second received signal strength indicator after the BPF if RSSI_A exceeds the predefined threshold;

determining if intermodulation interference is present by using RSSI_B;

optimizing a signal-to-interference ratio of the mixer by setting the gain of the LNA to have the mixer operate significantly within its linear region of operation, if intermodulation interference is detected; and setting the gain of the LNA so that RSSI_B exceeds a predetermined minimum, in which a combination of RSSI_A and RSSI_B based gain adjustments of the LNA is employed to compensate for intermodulation interference.

2. The method of claim 1, wherein determining intermodulation interference includes adjusting the gain of the LNA by a gain adjustment step to measure a second RSSI_B (RSSI_B') to determine if a difference between RSSI_B and RSSI_B' is not linearly related to the gain adjustment step.

3. A Radio Frequency unit comprising:

a transmit/receive block coupled to an antenna;

transmit circuitry that receives Intermediate Frequency (IF) transmit data from a host device, that converts the IF transmit data to an RF transmit signal and that couples the RF transmit signal to the transmit/receive block for transmission;

a Low Noise Amplifier (LNA) operably coupled to the transmit/receive block to receive an RF receive signal;

a mixer coupled to receive an output of the LNA;

a Band Pass Filter (BPF) coupled to an output of the mixer;

a first received signal strength indicator coupled to the output of the mixer that indicates a wideband signal strength indication (RSSI_A);

a second received signal strength indicator coupled after the BPF that indicates a narrowband signal strength indication (RSSI_B); and an LNA gain adjustment block that operates to:

reduce gain of the LNA if mixer non-linearity is present based upon RSSI_A, until the mixer is no longer driven into non-linearity;

optimize a signal-to-interference ratio of the mixer by setting the gain of the LNA to have the mixer operate significantly within its linear region of operation, if intermodulation interference is detected by RSSI_B, when RSSI_A exceeds a predefined threshold (THUR_B) to place the mixer to operate in an upper range of mixer operation; and     set the gain of the LNA so that RSSI_B exceeds a predetermined minimum, in which a combination of RSSI_A and RSSI_B based gain adjustments of the LNA is employed to compensate for intermodulation interference.

4. The Radio Frequency unit of claim 3, wherein the LNA gain adjustment block adjusts the gain of the LNA by a gain adjustment step to determine if a difference between a second RSSI_B (RSSI_B') and RSSI_B is not linearly related in order to detect intermodulation interference.

\* \* \* \* \*